United States Patent
Kuah et al.

(10) Patent No.: US 9,947,561 B2
(45) Date of Patent: Apr. 17, 2018

(54) SEMICONDUCTOR ENCAPSULATION SYSTEM COMPRISING A VACUUM PUMP AND A RESERVOIR PUMP

(71) Applicant: ASM TECHNOLOGY SINGAPORE PTE LTD, Singapore (SG)

(72) Inventors: Teng Hock Kuah, Singapore (SG); Chee Toh Teh, Singapore (SG); Shu Chuen Ho, Singapore (SG); Kai Wu, Singapore (SG); Chin Chong Lee, Singapore (SG)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 15/062,396

(22) Filed: Mar. 7, 2016

(65) Prior Publication Data
US 2017/0252954 A1 Sep. 7, 2017

(51) Int. Cl.
*H01L 21/67* (2006.01)
*B29C 45/14* (2006.01)
(Continued)

(52) U.S. Cl.
CPC ........ *H01L 21/67126* (2013.01); *B29C 45/04* (2013.01); *B29C 45/14065* (2013.01);
(Continued)

(58) Field of Classification Search
CPC ......... H01L 21/67126; H01L 21/67011; B29C 45/14655; B29C 45/04; B29C 45/14065; B29C 37/00; B29C 45/27; B29C 2045/1784; B29C 51/26; B29C 51/265; B29C 70/70; B29C 33/18;
(Continued)

(56) References Cited

U.S. PATENT DOCUMENTS 4,187,327 A * 2/1980 Lapp ................. H01G 4/22
29/25.42
5,603,879 A * 2/1997 Osada ............... B29C 45/14655
264/102

(Continued)

*Primary Examiner* — Jacob T Minskey
*Assistant Examiner* — Taryn Trace Willett
(74) *Attorney, Agent, or Firm* — Ostrolenk Faber LLP

(57) ABSTRACT

A semiconductor encapsulation apparatus for encapsulating a semiconductor device on a substrate, the apparatus comprising a mold comprising a cavity pressure zone that is configured to be at a molding process pressure during molding, a base vacuum pump conduit connecting a base vacuum pump to the cavity pressure zone, a base vacuum valve located along the base vacuum pump conduit such that the base vacuum pump is in fluid communication with the cavity pressure zone when the base vacuum valve is open, a reservoir vacuum pump conduit connecting a reservoir vacuum pump to the base vacuum pump conduit, and a reservoir vacuum valve located along the reservoir vacuum pump conduit such that the reservoir vacuum pump is in fluid communication with the base vacuum pump conduit when the reservoir vacuum valve is open. The base vacuum pump and the reservoir vacuum pump are each operative to reduce a pressure of the cavity pressure zone to the molding process pressure when they are in fluid communication with the cavity pressure zone.

11 Claims, 6 Drawing Sheets

(51) Int. Cl.
*B29C 45/04* (2006.01)
*B29C 45/17* (2006.01)
*B29C 45/76* (2006.01)
*B29C 45/26* (2006.01)
*B29L 31/34* (2006.01)

(52) U.S. Cl.
CPC .... *B29C 45/14655* (2013.01); *B29C 45/1701* (2013.01); *B29C 45/263* (2013.01); *B29C 45/76* (2013.01); *B29C 2045/14155* (2013.01); *B29C 2045/14663* (2013.01); *B29C 2045/2665* (2013.01); *B29C 2945/76006* (2013.01); *B29C 2945/76498* (2013.01); *B29L 2031/3481* (2013.01)

(58) Field of Classification Search
CPC ............ B29C 2043/3644; B29C 43/56; B29C 2043/561; B29C 43/58; B29C 2043/5808; B29C 66/00145
See application file for complete search history.

(56) References Cited

U.S. PATENT DOCUMENTS

| | | | | |
|---|---|---|---|---|
| 5,736,915 A * | 4/1998 | Goedde | ................... | H01F 27/14 336/55 |
| 5,874,324 A * | 2/1999 | Osada | ..................... | B29C 43/12 257/E21.504 |
| 7,128,562 B2 * | 10/2006 | Doi | .......................... | B29C 45/34 425/388 |
| 2001/0013674 A1 * | 8/2001 | Shimizu | ............ | B29C 45/14655 264/511 |
| 2002/0012716 A1 * | 1/2002 | Mishima | ............ | B29C 45/14655 425/116 |
| 2003/0183972 A1 * | 10/2003 | Weber | ................. | B29C 47/8895 264/85 |
| 2004/0215405 A1 * | 10/2004 | Siloy | ........................ | B29C 45/76 702/50 |
| 2004/0253334 A1 * | 12/2004 | Bandoh | ................... | B29C 33/10 425/117 |
| 2007/0075503 A1 * | 4/2007 | Hayashi | ................. | F16J 15/104 277/589 |
| 2007/0085237 A1 * | 4/2007 | Onishi | ..................... | B29C 33/68 264/272.11 |
| 2009/0291532 A1 * | 11/2009 | Takase | ..................... | B29C 43/18 438/127 |
| 2011/0169195 A1 * | 7/2011 | Yoo | .......................... | B29C 45/02 264/328.1 |
| 2014/0230930 A1 * | 8/2014 | Lim | ................... | H01L 21/67126 137/589 |
| 2014/0291881 A1 * | 10/2014 | Jang | .................. | B29C 45/34 264/102 |
| 2015/0170938 A1 * | 6/2015 | Seigeot | ................... | F04B 37/14 137/240 |
| 2015/0371880 A1 * | 12/2015 | De Beijer | ......... | H01L 21/67092 257/787 |
| 2016/0372347 A1 * | 12/2016 | Kim | .................. | H01L 21/67253 |

* cited by examiner

SEMICONDUCTOR ENCAPSULATION SYSTEM COMPRISING A VACUUM PUMP AND A RESERVOIR PUMP

FIELD OF THE INVENTION

The invention relates to the encapsulation of semiconductor devices, and in particular to the molding of semiconductor devices.

BACKGROUND

After a semiconductor wafer has gone through processing to form connections for semiconductor devices, the semiconductor devices are generally encapsulated with a molding material, for example a resin, in order to protect the semiconductor devices from physical and environmental damage. In order to form the resin into a desired shape and size, semiconductor substrates are placed into one or more cavities and the resin is introduced into the one or more cavities such that the resin is molded into the desired shape and size over the semiconductor substrates.

Compression molding and transfer molding are molding techniques commonly used to coat semiconductor substrates with resin. It is possible both in the case of compression molding and in the case of transfer molding, for a molding system to comprise a plurality of molding presses, each molding press comprising one or more cavities.

In the case of compression molding, a molding material, which may take the form of preheated paste or pellets, is introduced into the open, usually heated cavity of the molding press, which is subsequently closed. The molding material is pressed by the molding press under pressure, and the molding material melts and fills the cavity completely. The molding material remains in the cavity until it has cured.

In the case of transfer molding, a defined quantity of the molding material, typically a thermosetting material, is liquefied by heat and pressure, and then forced into the one or more cavities through an inlet, and is held there under heat and pressure until the resin has solidified. The molding material is usually introduced into each cavity simultaneously from a supply container through branched feeding lines.

The walls of the one or more cavities are typically heated to a temperature which is above the melting temperature of the molding material in order to obtain appropriate viscosity of the molding material within the one or more cavities. Despite that, pockets of air or gas may form in the molding material in the one or more cavities, especially in regions in the one or more cavities that are particularly intricate or narrow thereby creating voids in the molding material. Voids may cause the semiconductor device to malfunction, and the yield rate of the semiconductor devices to drop.

One technique of reducing or preventing the formation of voids is to use vacuum to assist the molding process. FIG. 1 shows a conventional multi-press molding apparatus or system 10 comprising a plurality of molding presses 12, and a respective vacuum pump 14 connected to each molding press 12. Each vacuum pump 14 would pump out the air from and reduce the pressure in the respective molding press 12 connected to it. For example a first vacuum pump 14a would pump out the air from and reduce the pressure in a first molding press 12a, thus creating a vacuum in one or more cavities of the first molding press 12a.

If the first vacuum pump 14a should malfunction during the molding process, there would be no vacuum (atmospheric pressure) or an inadequate vacuum (pressure substantially higher than the target molding process pressure) in the one or more cavities of the first molding press 12a. This would result in the semiconductor devices molded in the first molding press 12a being of a lower quality, for example due to the formation of voids in the molded semiconductor devices. The semiconductor devices molded in the first molding press 12a would have to be discarded, and this results in wastage and higher costs.

SUMMARY OF THE INVENTION

It is thus an object of this invention to seek to provide a semiconductor encapsulation system which helps to improve molding quality and thereby reduce the amount of yield loss as compared to the prior art.

According to a first aspect of the present invention, there is provided a semiconductor encapsulation apparatus for encapsulating a semiconductor device on a substrate, the apparatus comprising a mold comprising a cavity pressure zone that is configured to be at a molding process pressure during molding, a base vacuum pump conduit connecting a base vacuum pump to the cavity pressure zone, a base vacuum valve located along the base vacuum pump conduit such that the base vacuum pump is in fluid communication with the cavity pressure zone when the base vacuum valve is open, a reservoir vacuum pump conduit connecting a reservoir vacuum pump to the base vacuum pump conduit, and a reservoir vacuum valve located along the reservoir vacuum pump conduit such that the reservoir vacuum pump is in fluid communication with the base vacuum pump conduit when the reservoir vacuum valve is open. The base vacuum pump and the reservoir vacuum pump are each operative to reduce a pressure of the cavity pressure zone to the molding process pressure when they are in fluid communication with the cavity pressure zone.

According to a second aspect of the present invention, there is provided a semiconductor encapsulation apparatus for encapsulating a semiconductor device on a substrate, the apparatus comprising a first mold comprising a first cavity pressure zone and a second mold comprising a second cavity pressure zone, the first and second cavity pressure zones being configured to be at a molding process pressure during molding, a first base vacuum pump conduit connecting a first base vacuum pump to the first cavity pressure zone and a second base vacuum pump conduit connecting a second base vacuum pump to the second cavity pressure zone, a first base vacuum valve located along the first base vacuum pump conduit and a second base vacuum valve located along the second base vacuum pump conduit such that the first and second base vacuum pumps are in fluid communication with the respective first and second cavity pressure zones when the first base vacuum valve and the second base vacuum valve respectively are open, a first reservoir vacuum pump conduit connecting a reservoir vacuum pump to the first base vacuum pump conduit and a second reservoir vacuum pump conduit connecting the reservoir vacuum pump to the second base vacuum pump conduit, and a first reservoir vacuum valve located along the first reservoir vacuum pump conduit and a second reservoir vacuum valve located along the second reservoir vacuum pump conduit such that the reservoir vacuum pump is in fluid communication with the first base vacuum pump conduit and the second base vacuum pump conduit when the first and second reservoir vacuum valves respectively are open. The first base vacuum pump and the reservoir vacuum pump are operative to reduce a pressure of the first cavity pressure zone to the molding process pressure, and the second base vacuum pump and the reservoir vacuum pump are operative to reduce a pressure of the second cavity pressure zone to the molding pressure, when they are respectively in fluid communication with the cavity pressure zone.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION

Figure 1:
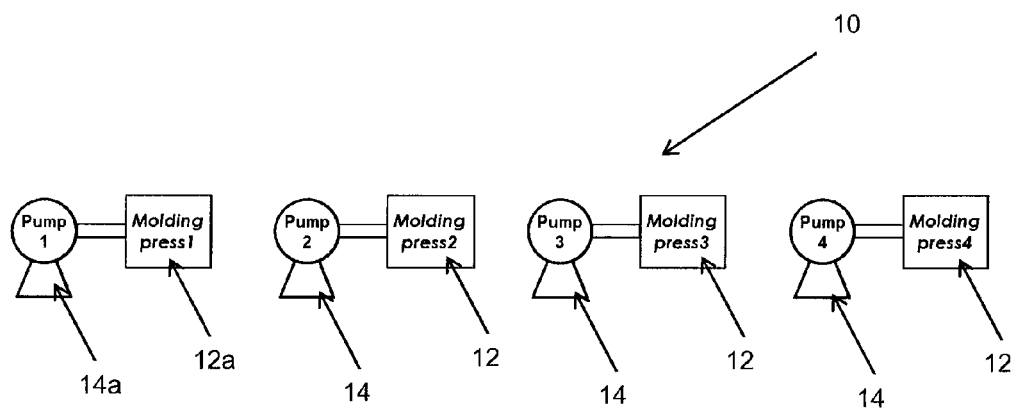
FIG. 1 shows a conventional molding system.
Figure 2:
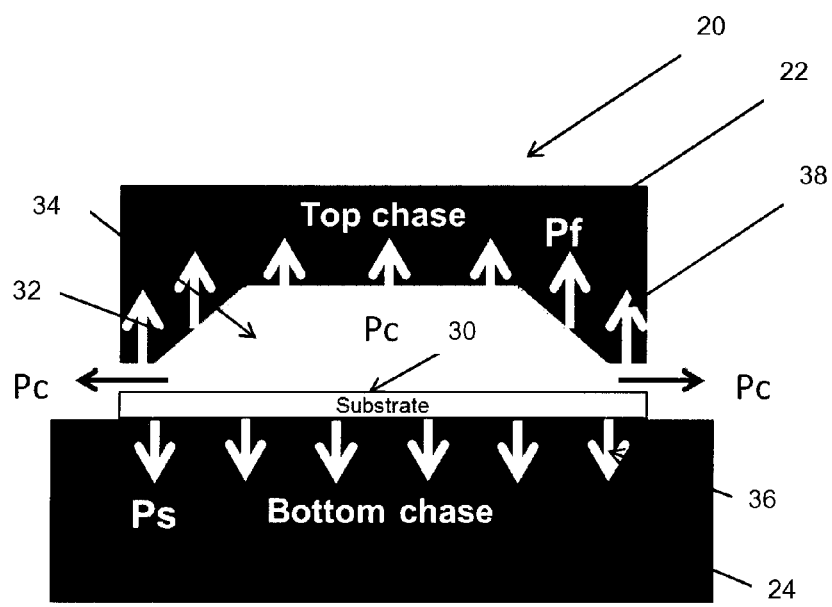
FIG. 2 is a sectional view of a molding press according to a preferred embodiment of the present invention.

FIG. 2 is a sectional view of a molding press 20 according to a preferred embodiment of the present invention. The molding press 20 may be the only molding press 20 or one of a plurality of molds or molding presses 20 comprised in a molding system. The molding press 20 comprises a top mold chase or a first mold part 22 and bottom mold chase or a second mold part 24. A substrate 30 is supported on a top surface of the bottom mold chase 24, and a film 32 is laid against a bottom surface of the top mold chase 22.

The top mold chase 22 and the bottom mold chase 24 are movable relative to each other between an open position and a closed position. In the closed position, the top mold chase 22 and the bottom mold chase 24 are moved adjacent to each other and cooperate to form a cavity pressure zone 34 in which a vacuum may be formed. In the closed position, the top mold chase 22 clamps onto the substrate 30. In the open position, the top mold chase 22 and the bottom mold chase 24 are moved apart such that the top mold chase 22 is not touching the substrate 30 and no vacuum may be formed.

The molding press 20 comprises a first set of holes or exhaust (not shown) for reducing the pressure and generating a cavity vacuum (Pc) in the cavity pressure zone 34 when the molding press 20 is in the closed position. The pressure of the cavity vacuum (Pc) in the cavity pressure zone 34 should be at a sufficiently low pressure (the target molding process pressure) during the molding process.

The molding press 20 also comprises a second set of holes or exhaust (not shown) for reducing the pressure and generating a substrate vacuum (Ps) in a substrate pressure zone 36 in order to secure or hold the substrate 30 in place on the bottom mold chase 24. The substrate 30 is placed on the bottom mold chase 24, such that a back surface of the substrate 30 covers the second set of holes, and a front surface of the substrate 30 is in fluid communication with the cavity pressure zone 34. When the pressure is reduced and substrate vacuum (Ps) is generated in the substrate pressure zone 36, the substrate is absorbed and held onto the bottom mold chase 24 so that the substrate 30 does not move. The substrate 30 may comprise semiconductor devices formed onto it, or may for example be a lead frame 30 with semiconductor dice mounted on the lead frame 30.

The molding press 20 further comprises a third set of holes or exhaust (not shown) for reducing the pressure and generating a film vacuum (Pf) in a film pressure zone 38 in order to secure the film 32 in place against the top mold chase 22. The film 32 may be a release film 32 that prevents the molding material from sticking on the surface of the molding press 20 after the molding or encapsulation process. The release film 32 ensures that the molding material can be released easily. The film 32 extends across the surface of the top mold chase 22, such that the film 32 covers the third set of holes. When the pressure is reduced and film vacuum (Pf) is generated in the film pressure zone 38, the film is absorbed and held against the top mold chase 22. It may not be necessary to generate the film vacuum (Pf) in the film pressure zone 36 if the film 32 is not used.

One advantage of having three sets of holes, each connected to a respective pressure zone 34, 36, 38, is that the pressure at each of the pressure zones 34, 36, 38 can be individually controlled.

Figure 3:
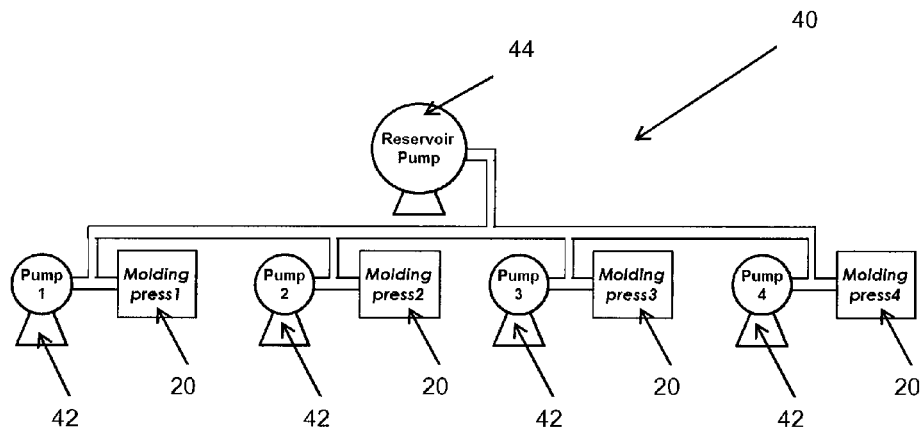
FIG. 3 shows a molding system according to the preferred embodiment of the present invention.

FIG. 3 shows a molding system 40 according to the preferred embodiment of the present invention. The molding system 40 comprises a plurality of molding presses 20, each molding press 20 being connected to a respective vacuum pump 42. The molding system 40 comprises a plurality of vacuum pump conduits, where a separate vacuum pump conduit connects each molding press 20 to a respective vacuum pump 42. The molding system 40 may alternatively comprise one single molding press 20. The molding system further comprises a reservoir pump 44 connected to the plurality of molding presses 20. The molding system 40 comprises a plurality of reservoir pump conduits, where each reservoir pump conduit connects a respective molding press 20 to the reservoir pump 44. Each reservoir pump conduit is connected to a respective vacuum pump conduit such that the reservoir pump 44 is operative to be in fluid communication with the vacuum pumps 42.

Figure 4:
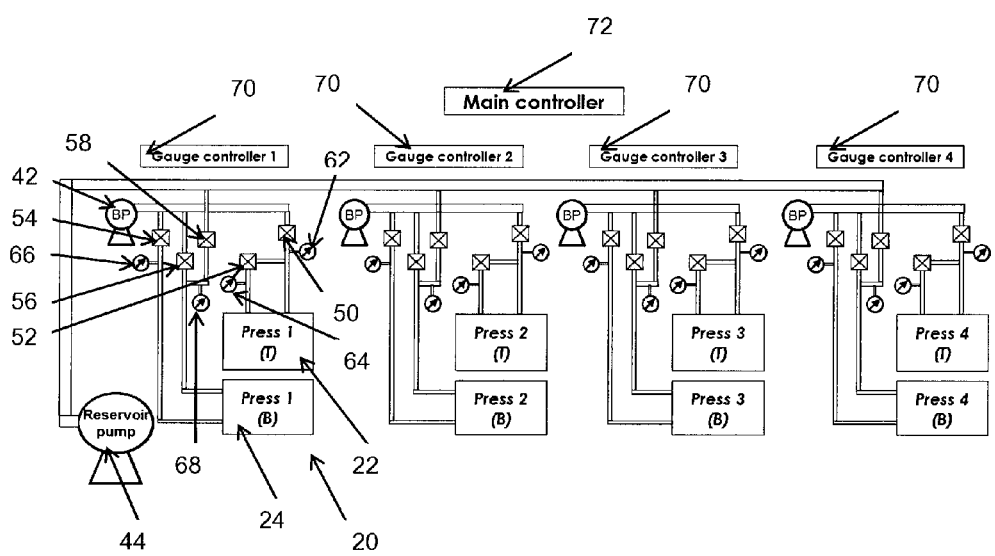
FIG. 4 shows the connections between the vacuum pumps, reservoir pump, and molding presses.

FIG. 4 shows the connections between the vacuum pumps 42, reservoir pump 44, and molding presses 20. Each vacuum pump 42 is connected to the third set of holes of a respective top mold chase 22 via a first valve 50 and a second valve 52, the second set of holes of a respective bottom mold chase 24 via a third valve 54, and the first set of holes of a respective molding press 20 via a fourth valve 56. A plurality of vacuum pump conduits connects each vacuum pump 42 to the respective molding press 20. The reservoir pump 44 is connected to the first set of holes of each of the plurality of molding presses 20 via a fifth valve 58. A respective reservoir pump conduit connects each molding press 20 to the reservoir pump 44. Advantageously, having only one reservoir pump connected to a plurality of molding presses 20 makes the molding system more cost-effective.

A first gauge 62 and a second gauge 64 measure the pressure of the film vacuum (Pf) of the film pressure zone 38, a third gauge 66 measures the pressure of the substrate vacuum (Ps) of the substrate pressure zone 36, and a fourth gauge 68 measures the pressure of the cavity vacuum (Pc) of the cavity pressure zone 34. The molding system 40 comprises a plurality of gauge controllers 70, wherein each gauge controller 70 controls the valves 50, 52, 54, 56, 58 of a respective molding press 20, and a main controller 72 controls the plurality of gauge controllers 70.

Figure 5:
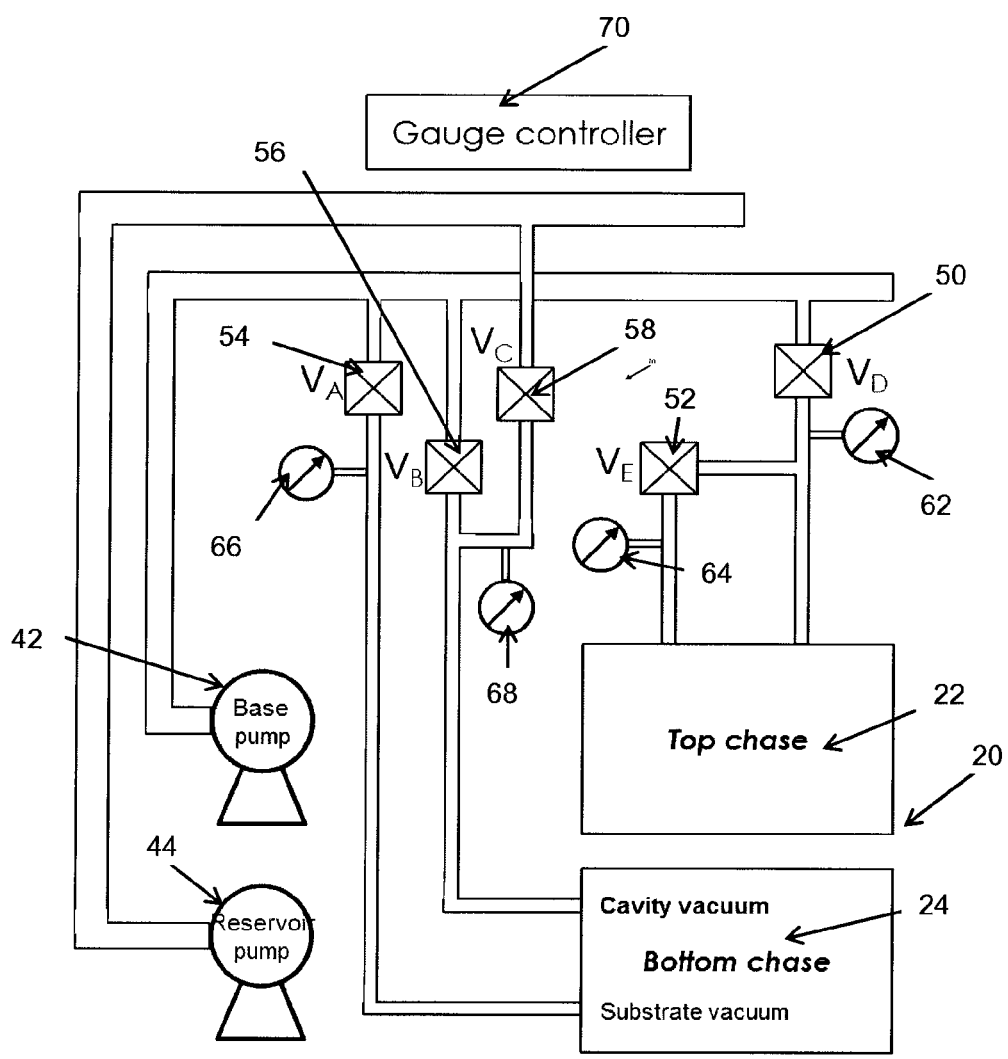
FIG. 5 shows the connections between one of the vacuum pumps, reservoir pump, and one of the molding presses.

FIG. 5 shows the connections between one of the vacuum pumps 42, reservoir pump 44, and one of the molding presses 20. The vacuum pump 42 is operative to fluidly communicate with the cavity pressure zone 34 via the fourth valve 56, the substrate pressure zone 36 via the third valve 54, and the film pressure zone 38 via the first valve 50 and the second valve 52. The valves 50, 52, 54, 56 are located on vacuum pump conduits between the vacuum pump 42 and the pressure zones 34, 36, 38. When the valves 50, 52, 54, 56 are open, the vacuum pump 42 is able to fluidly communicate with the respective pressure zones 34, 36, 38, and thus able to reduce the pressure and generate vacuum forces in the pressure zones 34, 36, 38. When the valves 50, 52, 54, 56 are closed, the vacuum pump 42 does not fluidly communicate with the pressure zones 34, 36, 38.

When the fifth valve 58 is open, the reservoir pump 44 fluidly communicates with the cavity pressure zone 34 via the fifth valve 58, to reduce the pressure and generate the cavity vacuum (Pc) of the cavity pressure zone 34. The fifth valve 58 is located on the reservoir pump conduit between the reservoir pump 44 and the cavity pressure zone 34. If the cavity vacuum (Pc) of the cavity pressure zone 34 is insufficient (the pressure of the cavity vacuum (Pc) is higher than the target molding process pressure), the affected encapsulated substrate 30 will be of a lower quality. Thus, one advantage of having the vacuum pump 42 and the reservoir pump 44 both connected to the cavity pressure zone 34, is that the reservoir pump 44 can assist in the pumping down of the pressure of the cavity pressure zone 34 in order to ensure that the cavity vacuum (Pc) is at or lower than the target molding process pressure. Another advantage is that if the vacuum pump 42 malfunctions during the molding process, the reservoir pump 44 would act as a backup pump to continue to pump down the pressure of the cavity pressure zone 34 to the target molding process pressure, thus allowing the molding process to continue normally. The substrate 30 being encapsulated would not turn out to be defective.

The gauge controller 70 monitors the pressures measured by the gauges 62, 64, 66, 68, and controls the opening and closing of the valves 50, 52, 54, 56, 58. During the molding process, the gauge controller 70 controls the opening and closing of the valves 50, 52, 54, 56, 58 such that the pressures of the film vacuum (Pf) and the substrate vacuum (Ps) are lower than the pressure of the cavity vacuum (Pc), in order for the film 32 and the substrate 30 to be secured in position. The film 32 may wrinkle or detach from the surface of the top mold chase 22 if the pressure of the film vacuum (Pf) is higher than the pressure of the cavity vacuum (Pc). Part of the substrate 30 that is not clamped may lift off from the bottom mold chase 24 if the pressure of the substrate vacuum (Ps) is higher than the pressure of the cavity vacuum (Pc).

In operation, initially, the vacuum pump 42 and the reservoir pump 44 are both switched on, with all the valves 50, 52, 54, 56, 58 closed and the molding press 20 in the open position. First, the first valve 50 and the second valve 52 are opened, such that the vacuum pump 42 fluidly communicates with the film pressure zone 38 through the third set of holes. The vacuum pump 42 reduces the pressure of the film vacuum (Pf) of the film pressure zone 38 such that the film 32 is secured or held in place against the top mold chase 22. The first gauge 62 and the second gauge 64 measure and monitor the pressure of the film vacuum (Pf) of the film pressure zone 38. Subsequently, the third valve 54 is opened, such that the vacuum pump 42 fluidly communicates with the substrate pressure zone 36 through the second set of holes. The vacuum pump 42 reduces the pressure of the substrate vacuum (Ps) of the substrate pressure zone 36 such that the substrate 30 is secured or held in place on the bottom mold chase 24. The third gauge 66 measures and monitors the pressure of the substrate vacuum (Ps) of the substrate pressure zone 36.

Next, the top mold chase 22 and the bottom mold chase 24 move relative to each other to the closed position where the top mold chase 22 and the bottom mold chase 24 clamp the substrate 30, and the cavity pressure zone 34 is formed. The cavity pressure zone 34 is at atmospheric pressure. Then, the fourth valve 56 is opened, such that the vacuum pump 42 fluidly communicates with the cavity pressure zone 34 through the first set of holes. The vacuum pump 42 reduces the pressure of the cavity vacuum (Pc) of the cavity pressure zone 34 from atmospheric pressure to the target molding process pressure.

Thereafter, after a preset delay or interval, the fifth valve 58 is opened, such that the reservoir pump 44 fluidly communicates with the cavity pressure zone 34 through the first set of holes. The reservoir pump 44 helps the vacuum pump 42 to pump down the pressure of the cavity vacuum (Pc) of the cavity pressure zone 34 to the target molding process pressure or lower. If the vacuum pump 42 malfunctions during the molding process, there would no vacuum (atmospheric pressure) or an inadequate vacuum (pressure higher than target molding process pressure) in the cavity pressure zone 34. In this case, the reservoir pump 44 would act as a backup pump to pump down the pressure of the cavity pressure zone 34 to the target molding process pressure, thus allowing the molding process to continue normally and the affected encapsulated substrate 30 would not need to be discarded after the molding process.

Finally, the molding material, which may take the form of paste or pellets, is liquefied by heat and pressure, and then forced into the cavity pressure zone 34 through an inlet (not shown) until the cavity pressure zone 34 is completely filled. The molding material may also be introduced into the cavity pressure zone 34 simultaneously as the vacuum pump 42 and/or the reservoir pump 44 are in the process of reducing the pressure of the cavity vacuum (Pc) of the cavity pressure zone 34. The molding material encapsulates the substrate 30 and may be subsequently cured. Then, the encapsulated substrate 30 may be removed from the molding press 20.

Figure 6:
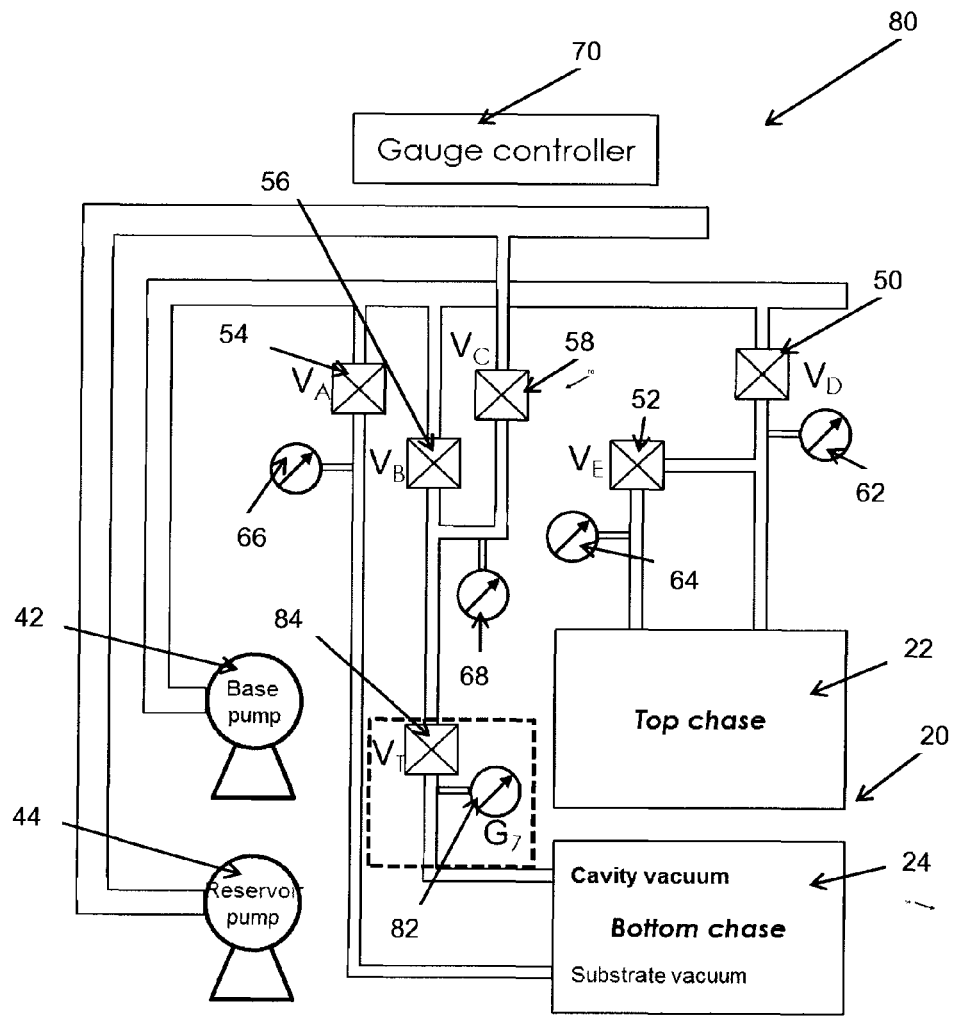
FIG. 6 shows a molding system comprising the vacuum pump and the reservoir pump, according to another preferred embodiment of the present invention.

FIG. 6 shows a molding system 80 comprising the vacuum pump 42 and the reservoir pump 44, according to another embodiment of the present invention. The molding system 80 comprises the pumps 42, 44, the molding press 20, the valves 50, 52, 54, 56, 58, the gauges 62, 64, 66, 68, and the gauge controller 70. In addition, the molding system comprises a sixth valve 84, a fifth gauge 82, and an input mechanism (not shown) for allowing a user to input a cavity pressure zone 34 pressure target value. The sixth valve 84 is located along a vacuum pump conduit between the cavity pressure zone 34 and a point where a reservoir pump conduit is connected to the vacuum pump conduit.

The input mechanism may be any suitable mechanism which allows the user to input the cavity pressure zone 34 pressure target value, and may for example, be comprised in the fifth gauge 82, the gauge controller 70, or the main controller 72. During the molding process, the fifth gauge 82 measures the pressure of the cavity vacuum (Pc) of the cavity pressure zone 34, and the molding system 80 controls the opening and closing of the sixth valve 84 to maintain the pressure of the cavity vacuum (Pc) of the cavity pressure zone 34 at the target value. The sixth valve 84 is operative to maintain the pressure of the cavity pressure zone 34 by allowing or blocking fluid communication between the pumps 42, 44 and the cavity pressure zone 34. The molding system 80 opens the sixth valve 84 when the pressure of the cavity vacuum (Pc) of the cavity pressure zone 34 is higher than the target value, so that the vacuum pump 42 and the reservoir pump 44 fluidly communicate with the cavity pressure zone 34 through the first set of holes to reduce the pressure of the cavity vacuum (Pc). The molding system 80 closes the sixth valve 84 when the pressure of the cavity vacuum (Pc) of the cavity pressure zone 34 is lower than the target value.

Figure 7:
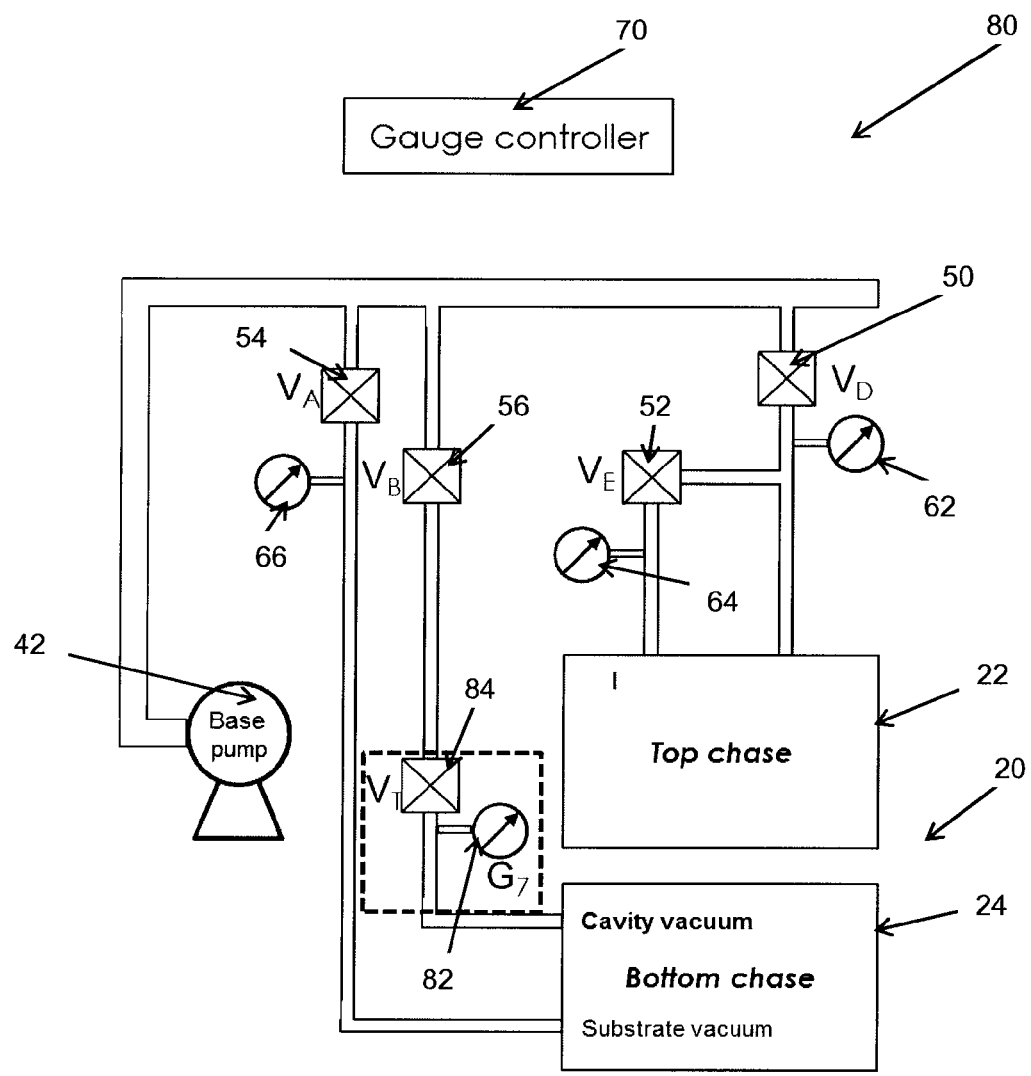
FIG. 7 shows the molding system comprising the vacuum pump.

FIG. 7 shows the molding system 80 comprising the vacuum pump 42. The molding system 80 may work without the reservoir pump 44. Therefore, when the pressure of the cavity vacuum (Pc) of the cavity pressure zone 34 is higher than the target value, the sixth valve 84 opens, and the vacuum pump 42 (without the reservoir pump 44) fluidly communicates with the cavity pressure zone 34 through the first set of holes to pump down the pressure of the cavity vacuum (Pc).

Figure 8:
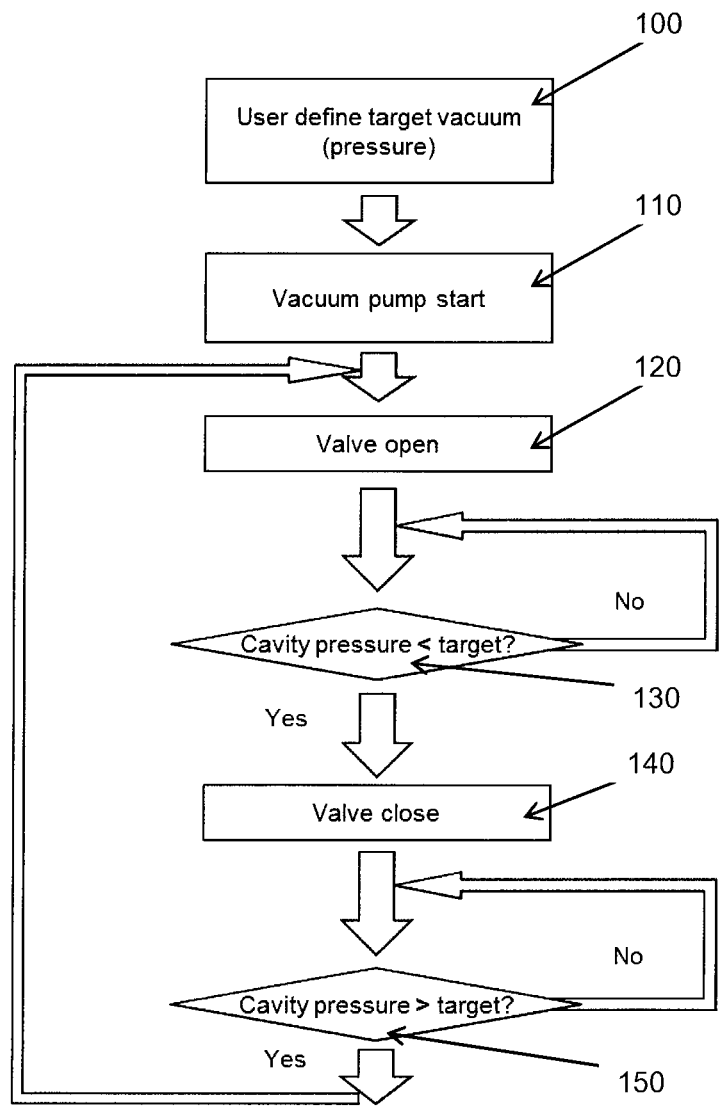
FIG. 8 shows an operation of a preferred embodiment of the molding system.

FIG. 8 shows an operation of a preferred embodiment of the molding system 80. At step 100, the user defines the target value of the cavity vacuum (Pc) of the cavity pressure zone 34, by inputting the target value into the input mechanism. At step 110, the vacuum pump 42 and the reservoir pump 44 are activated.

At step 120, the fourth valve 56, fifth valve 58, and sixth valve 84 open and the pressure of the cavity vacuum (Pc) of the cavity pressure zone 34 starts to be pumped down to the target value by the pumps 42, 44. At step 130, the molding system 80 checks whether the pressure of the cavity vacuum (Pc) of the cavity pressure zone 34 measured by the fifth gauge 82 is below the target value. If the pressure is not below the target value, the fourth valve 56, fifth valve 58, and sixth valve 84 remain open, and the molding system 80 checks the pressure again after a preset interval. If the pressure is below the target value, the operation proceeds to step 140, where the sixth valve 84 is closed. At step 150, the molding system 80 checks whether the pressure of the cavity vacuum (Pc) of the cavity pressure zone 34 measured by the fifth gauge 82 is above the target value. If the pressure is not above the target value, the sixth valve 84 remains closed, and the molding system 80 checks the pressure again after a preset interval. If the pressure is above the target value, the operation returns to step 120, where the sixth valve 84 is opened.

The steps 120, 130, 140, 150 are repeated until the molding process is completed. Then the encapsulated substrate 30 is thereafter removed from the molding press 20.

The film 32 may wrinkle or detach from the surface of the top mold chase 22, if the pressure of the film vacuum (Pf) is higher than the pressure of the cavity vacuum (Pc). The substrate 30 may also lift off from the bottom mold chase 24, if the pressure of the substrate vacuum (Ps) is higher than the pressure of the cavity vacuum (Pc). Therefore, one advantage of the input mechanism, which allows the user to input the cavity pressure zone 34 pressure target value, is to help ensure that the pressure of the cavity vacuum (Pc) is higher than the pressure of the substrate vacuum (Ps) and/or is lower than the pressure of the film vacuum (Pf). One advantage of the sixth valve 84 is that the sixth valve 84 may be used to control the pressure of the cavity vacuum (Pc) to prevent the pressure from dropping too low.

Although the present invention has been described in considerable detail with reference to certain embodiments, other embodiments are possible.

For example, instead of using the film 32, the surface of the molding press 20 may be coated with a release material for providing a non-adhering surface for the molding material or resin, so that after the encapsulation or molding process, the encapsulated substrate 30 can be easily removed from the molding press 20. The release material may for example be Teflon.

The molding systems 40, 80 may have other configurations. For example, each molding press 20 may be individually connected to a respective reservoir pump 44. In addition, each molding press 20 may also be connected to a respective vacuum pump 42 or a plurality of vacuum pumps 42, or each vacuum pump 42 may be connected a plurality of molding presses 20.

In addition to allowing the user to input the cavity pressure zone 34 pressure target value, the input mechanism may also be used to allow the user to input a substrate pressure zone 36 pressure target value and/or a film pressure zone 38 pressure target value.

Therefore, the spirit and scope of the appended claims should not be limited to the description of the embodiments contained herein.

The invention claimed is:

1. A semiconductor encapsulation apparatus for encapsulating a semiconductor device on a substrate, the apparatus comprising:
   a mold comprising a cavity pressure zone that is configured to be at a molding process pressure during encapsulation of the semiconductor device on the substrate by the semiconductor encapsulation apparatus;
   a base vacuum pump conduit connecting a base vacuum pump to the cavity pressure zone;
   a base vacuum valve located along the base vacuum pump conduit such that the base vacuum pump is in fluid communication with the cavity pressure zone when the base vacuum valve is open;
   a reservoir vacuum pump conduit connecting a reservoir vacuum pump to the base vacuum pump conduit at a conduit connection point; and
   a reservoir vacuum valve located along the reservoir vacuum pump conduit such that the reservoir vacuum pump is in fluid communication with the cavity pressure zone via the base vacuum pump conduit when the reservoir vacuum valve is open;
   wherein the base vacuum pump conduit connects the cavity pressure zone to the base vacuum pump and to the reservoir vacuum pump via the reservoir pump conduit, and the base vacuum pump and the reservoir vacuum pump are each operative to reduce a pressure of the cavity pressure zone to the molding process pressure when they are in fluid communication with the cavity pressure zone;
   wherein the conduit connection point is located between the base vacuum valve and the cavity pressure zone, and between the reservoir vacuum valve and the cavity pressure zone.

2. The semiconductor encapsulation apparatus of claim 1, further comprising an input device for entering a pressure set point for setting the molding process pressure.

3. The semiconductor encapsulation apparatus of claim 2, further comprising a pressure control valve operative to maintain the pressure of the cavity pressure zone at the molding process pressure by allowing or blocking fluid communication between the base vacuum pump and the reservoir vacuum pump and the cavity pressure zone.

4. The semiconductor encapsulation apparatus of claim 3, wherein the pressure control valve is located along the base vacuum pump conduit between the cavity pressure zone and a point where the reservoir vacuum pump conduit is connected to the base vacuum pump conduit.

5. The semiconductor encapsulation apparatus of claim 1, further comprising a gauge to measure the pressure in the base vacuum pump conduit and the reservoir vacuum pump conduit, wherein the gauge is connected to the base vacuum pump conduit between the cavity pressure zone and a point where the reservoir vacuum pump conduit is connected to the base vacuum pump conduit.

6. A semiconductor encapsulation apparatus for encapsulating a semiconductor device on a substrate, the apparatus comprising:
- a first mold comprising a first cavity pressure zone and a second mold comprising a second cavity pressure zone, the first and second cavity pressure zones being configured to be at a molding process pressure during encapsulation of the semiconductor device on the substrate by the semiconductor encapsulation apparatus;
- a first base vacuum pump conduit connecting a first base vacuum pump to the first cavity pressure zone and a second base vacuum pump conduit connecting a second base vacuum pump to the second cavity pressure zone;
- a first base vacuum valve located along the first base vacuum pump conduit and a second base vacuum valve located along the second base vacuum pump conduit such that the first and second base vacuum pumps are in fluid communication with the respective first and second cavity pressure zones when the first base vacuum valve and the second base vacuum valve respectively are open;
- a first reservoir vacuum pump conduit connecting a reservoir vacuum pump to the first base vacuum pump conduit at a first conduit connection point and a second reservoir vacuum pump conduit connecting the reservoir vacuum pump to the second base vacuum pump conduit at a second conduit connection point; and
- a first reservoir vacuum valve located along the first reservoir vacuum pump conduit and a second reservoir vacuum valve located along the second reservoir vacuum pump conduit such that the reservoir vacuum pump is in fluid communication with the first cavity pressure zone via the first base vacuum pump conduit and in fluid communication with the second cavity pressure zone via the second base vacuum pump conduit when the first and second reservoir vacuum valves respectively are open;
- wherein the first base vacuum pump conduit connects the first cavity pressure zone to the first base vacuum pump and to the reservoir vacuum pump via the first reservoir pump conduit, and the first base vacuum pump and the reservoir vacuum pump are operative to reduce a pressure of the first cavity pressure zone to the molding process pressure when they are respectively in fluid communication with the first cavity pressure zone, and the second base vacuum pump conduit connects the second cavity pressure zone to the second base vacuum pump and to the reservoir vacuum pump via the second reservoir pump conduit, and the second base vacuum pump and the reservoir vacuum pump are operative to reduce a pressure of the second cavity pressure zone to the molding pressure, when they are respectively in fluid communication with the second cavity pressure zone;

wherein the first conduit connection point is located between the first base vacuum valve and the first cavity pressure zone, and between the first reservoir vacuum valve and the first cavity pressure zone; and the second conduit connection point is located between the second base vacuum valve and the second cavity pressure zone, and between the second reservoir vacuum valve and the second cavity pressure zone.

7. The semiconductor encapsulation apparatus of claim 6, further comprising a first input device and a second input device for entering a pressure set point for setting the molding process pressure.

8. The semiconductor encapsulation apparatus of claim 7, further comprising:
- a first pressure control valve operative to maintain the pressure of the first cavity pressure zone at the molding process pressure by allowing or blocking fluid communication between the first base vacuum pump and the reservoir vacuum pump and the first cavity pressure zone; and
- a second pressure control valve operative to maintain the pressure of the second cavity pressure zone at the molding process pressure by allowing or blocking fluid communication between the second base vacuum pump and the reservoir vacuum pump and the second cavity pressure zone.

9. The semiconductor encapsulation apparatus of claim 8, wherein the first pressure control valve is located along the first base vacuum pump conduit between the first cavity pressure zone and a point where the first reservoir vacuum pump conduit is connected to the first base vacuum pump conduit.

10. The semiconductor encapsulation apparatus of claim 8, wherein the second pressure control valve is located along the second base vacuum pump conduit between the second cavity pressure zone and a point where the second reservoir vacuum pump conduit is connected to the second base vacuum pump conduit.

11. The semiconductor encapsulation apparatus of claim 6, further comprising:
- a first gauge to measure the pressure in the first base vacuum pump conduit and the first reservoir vacuum pump conduit, wherein the first gauge is connected to the first base vacuum pump conduit between the first cavity pressure zone and a point where the first reservoir vacuum pump conduit is connected to the first base vacuum pump conduit; and
- a second gauge to measure the pressure in the second base vacuum pump conduit and the second reservoir vacuum pump conduit, wherein the second gauge is connected to the second base vacuum pump conduit between the second cavity pressure zone and a point where the second reservoir vacuum pump conduit is connected to the second base vacuum pump conduit.

* * * * *